United States Patent
Mankos

(10) Patent No.: US 8,183,526 B1
(45) Date of Patent: May 22, 2012

(54) MIRROR MONOCHROMATOR FOR CHARGED PARTICLE BEAM APPARATUS

(75) Inventor: Marian Mankos, Palo Alto, CA (US)

(73) Assignee: Electron Optica, Palo Alto, CA (US)

( * ) Notice: Subject to any disclaimer, the term of this patent is extended or adjusted under 35 U.S.C. 154(b) by 0 days.

(21) Appl. No.: 13/025,491

(22) Filed: Feb. 11, 2011

(51) Int. Cl.
*H01J 49/42* (2006.01)
*H01J 47/00* (2006.01)
*H01J 40/00* (2006.01)
*H01J 1/50* (2006.01)

(52) U.S. Cl. .............. 250/305; 250/396 ML; 250/396 R
(58) Field of Classification Search ................... 250/305, 250/311, 396 ML, 396 R
See application file for complete search history.

(56) References Cited

U.S. PATENT DOCUMENTS

| | | | | |
|---|---|---|---|---|
| 3,660,658 | A * | 5/1972 | Leboutet et al. | 250/398 |
| 4,740,704 | A * | 4/1988 | Rose et al. | 250/396 ML |
| 4,760,261 | A * | 7/1988 | Rose et al. | 250/396 ML |
| 4,810,879 | A * | 3/1989 | Walker | 250/305 |
| 4,851,670 | A * | 7/1989 | Krivanek | 250/305 |
| 5,126,565 | A | 6/1992 | Rose | |
| 5,166,519 | A * | 11/1992 | Turner | 250/305 |
| 5,319,207 | A * | 6/1994 | Rose et al. | 250/396 R |
| 5,321,262 | A * | 6/1994 | Turner | 250/305 |
| 5,336,891 | A * | 8/1994 | Crewe | 250/396 R |
| 5,449,914 | A * | 9/1995 | Rose et al. | 250/396 ML |
| 5,838,004 | A | 11/1998 | Tiemeijer | |
| 6,150,657 | A * | 11/2000 | Kimoto et al. | 250/305 |
| 6,307,205 | B1 * | 10/2001 | Tsuno | 250/396 ML |
| 6,441,378 | B1 * | 8/2002 | Tsuno et al. | 250/396 ML |
| 6,522,052 | B2 * | 2/2003 | Kihara et al. | 310/366 |
| 6,611,087 | B2 * | 8/2003 | Mauck | 313/359.1 |
| 6,803,571 | B1 * | 10/2004 | Mankos et al. | 850/9 |
| 6,815,880 | B2 * | 11/2004 | Mauck | 313/359.1 |
| 6,906,453 | B2 * | 6/2005 | Mauck | 313/359.1 |
| 6,947,629 | B2 * | 9/2005 | Chu et al. | 385/18 |
| 6,995,894 | B2 * | 2/2006 | Park | 359/290 |
| 7,078,852 | B2 * | 7/2006 | Mauck | 313/359.1 |
| 7,205,542 | B1 * | 4/2007 | Mankos et al. | 250/310 |
| 7,217,924 | B1 * | 5/2007 | Mankos et al. | 250/310 |
| 7,381,949 | B2 * | 6/2008 | Mauck | 250/298 |
| 2008/0258073 | A1 * | 10/2008 | Mauck | 250/396 ML |

* cited by examiner

*Primary Examiner* — Bernard E Souw

(57) ABSTRACT

One embodiment relates to an apparatus for generating a charged particle beam with reduced energy width. A charged particle source is configured to generate a charged particle beam with a range of energies. An energy-dispersive device bends the high-energy component of the charged particle beam at less of an angle in comparison to the bending angle of the low-energy component of the charged particle beam, such that the higher and lower energy charged particle beam components exit the energy-dispersive device at different angles of trajectory. A charged particle mirror reflects the charged particle beam such that charged particles entering at an angle with respect to the normal to the mirror reflection plane exit the mirror symmetrically with respect to the normal and at the same angle. Charged particle lenses converge all energy components exiting the energy-dispersive device at different angles of trajectory at the charged particle mirror reflection plane. A knife-edge plate removes all charged particles with energies higher and lower than a selected energy width. Other embodiments are also disclosed.

19 Claims, 6 Drawing Sheets

MIRROR MONOCHROMATOR FOR CHARGED PARTICLE BEAM APPARATUS

BACKGROUND OF THE INVENTION

1. Field of the Invention

The present invention relates generally to charged particle beam apparatus, and more specifically to electron microscopy and electron beam patterning methods.

2. Description of the Background Art

Optical microscopes, the simplest and most used instruments used to image objects too small for the naked eye to see, uses photons with visible wavelengths for imaging. The specimen is illuminated with a broad light beam, and a magnified image of the specimen can be observed using an eye piece or camera. The maximum magnification of a light microscope can be more than 1000× with a diffraction-limited resolution limit of a few hundred nanometers. Improved spatial resolution in an optical microscope can be achieved when shorter wavelengths of light, such as the ultraviolet, are utilized for imaging.

An electron microscope is a type of microscope that uses electrons to illuminate the specimen and create a magnified image of it. The microscope has a greater resolving power than a light microscope, because it uses electrons that have wavelengths few orders of magnitude shorter than visible light, and can achieve magnifications exceeding 1,000,000×. In a typical electron microscope, an electron beam is emitted in a vacuum chamber from an electron gun equipped with a thermionic (tungsten, $LaB_6$), thermally assisted (Schottky, $ZrO_2$) or cold field emission cathode. The electron beam, which typically has an energy ranging from a few hundred eV to few hundred keV and an energy spread ranging from few tenths to few eV, is collimated by one or more condenser lenses and then focused by the final objective lens to form a spot that illuminates the specimen. When the primary electron beam strikes the sample, the electrons deposit energy in a teardrop-shaped volume of the specimen known as the interaction volume, which extends from less than few nm to few μm into the surface, depending on the electron's landing energy and the composition of the specimen. Primary electrons can generate elastically scattered electrons, secondary electrons due to inelastic scattering, characteristic Auger electrons and the emission of electromagnetic radiation. Each of the generated signals can be detected by specialized detectors, amplified and displayed on a CRT display or captured digitally, pixel by pixel on a computer.

Scanning electron microscopes, the most widely used electron microscopes, image the sample surface by scanning it with a tightly focused beam of electrons in a raster scan pattern, pixel by pixel. Transmission electron microscopes (TEM) and low energy electron microscopes (LEEM) are projection (as opposed to scanning) electron microscopes, and thus resemble a conventional light microscope. In a TEM or LEEM, the electron gun forms a broad electron beam that is accelerated to typically a few to hundreds of keV and focused by the objective lens. A parallel flood beam then uniformly illuminates the substrate.

The finite, non-zero energy spread $\Delta E$ of the illuminating energy beam introduces chromatic aberrations that deteriorate the spatial resolution of electron beam instruments, including both scanning and projection electron microscopes as well as electron beam pattern generators. The primary chromatic aberration is proportional to the relative energy spread $\Delta E/E$, where E is the nominal beam energy. Since the chromatic aberration increases with decreasing beam energy, an appreciable improvement of the resolution can be achieved when the energy spread $\Delta E$ is reduced, in particular at low beam energies. The energy spread of commonly used thermionic (tungsten, $LaB_6$) and thermally assisted (Schottky, $ZrO_2$) field emission cathodes is typically in the range of 0.5 to 5 eV, and cold field emitters have an energy spread in the range of 0.3-0.5 eV. Effective means for reducing the energy spread of the primary electron beam illuminating the sample to 0.1 eV or less are therefore desirable for higher spatial resolution imaging and patterning.

One approach to reducing the energy spread of the primary electron beam illuminating the sample is to use an monochromator based on a Wien-type energy filter, such as the one disclosed in U.S. Pat. No. 5,838,004, which is entitled "Particle-optical apparatus comprising a fixed diaphragm for the monochromator filter" and which issued Nov. 17, 1998 to inventors Tiemeijer, Chmelik and Kruit. In this approach, the monochromator is located in the vicinity of the electron source and at high electric potential, where the kinetic energy of electrons is low and the Wien filter most effective. However, the energy dispersion of the Wien filter is rather low, and extremely narrow energy-selecting slits, 0.1 micrometer wide or smaller, must be employed. The manufacture of such fine structures is rather complicated and the reliability of operation under heavy electron bombardment is reduced due to hydrocarbon contamination. In addition, the design of the Wien filter and its electronic components is complicated due to the fact that the components are floating at high electrical potential.

Another approach to reducing the energy spread of the primary electron beam illuminating the sample is to use an omega-type energy filter, such as the one disclosed in U.S. Pat. No. 5,126,565, which is entitled "Energy filter for charged particle beam apparatus" and which issued Jun. 30, 1992 to inventor Rose. In this approach, the monochromator is located in the vicinity of the electron source and comprises 4 symmetrically arranged sector deflectors which introduce a dispersion which has a maximum at the center of the filter. However, the energy dispersion of the omega-type energy filter is still low. This means that when a energy width in the range of 0.1 eV is required, the filter must also be biased at high electric potentials, and narrow energy-selecting slits, about 1 micrometer wide, must be employed. The manufacture of such fine structures with straight and parallel edges is rather complicated. In addition, the design of the omega filter and its electronic components is complicated due to the fact that the components are floating at high electrical potential.

There is significant demand in biological and medical research as well materials science and semiconductor processing for imaging of specimens at high spatial resolution and with analytical capabilities provided by scanning and projection electron microscopes equipped with monochromators, as well as patterning of substrates at high spatial resolution provided by electron beam pattern generators equipped with monochromators.

SUMMARY

One embodiment pertains to an apparatus for generating a nearly monochromatic illumination electron beam. An electron beam source is configured to generate an electron beam, and condenser lenses focus the beam into a magnetic beam separator. After a 90 degree deflection, the beam separator introduces an angular dispersion that disperses the incoming electron beam according to its energy. A knife-edge plate removes either the high or low energy tail from the propagating beam. An electron lens is configured to focus the electron beam into an electron mirror so that after the reflection, the other energy tail is stopped on the same knife-edge plate. The remaining nearly monochromatic beam reenters the beam splitter and is deflected toward the objective lens configured to illuminate the specimen. The electrons are scattered by the specimen and used to form a two-dimensional image or pattern a substrate.

Other embodiments are also disclosed.

DETAILED DESCRIPTION

Electron Mirror-Based Monochromator

Figure 1:
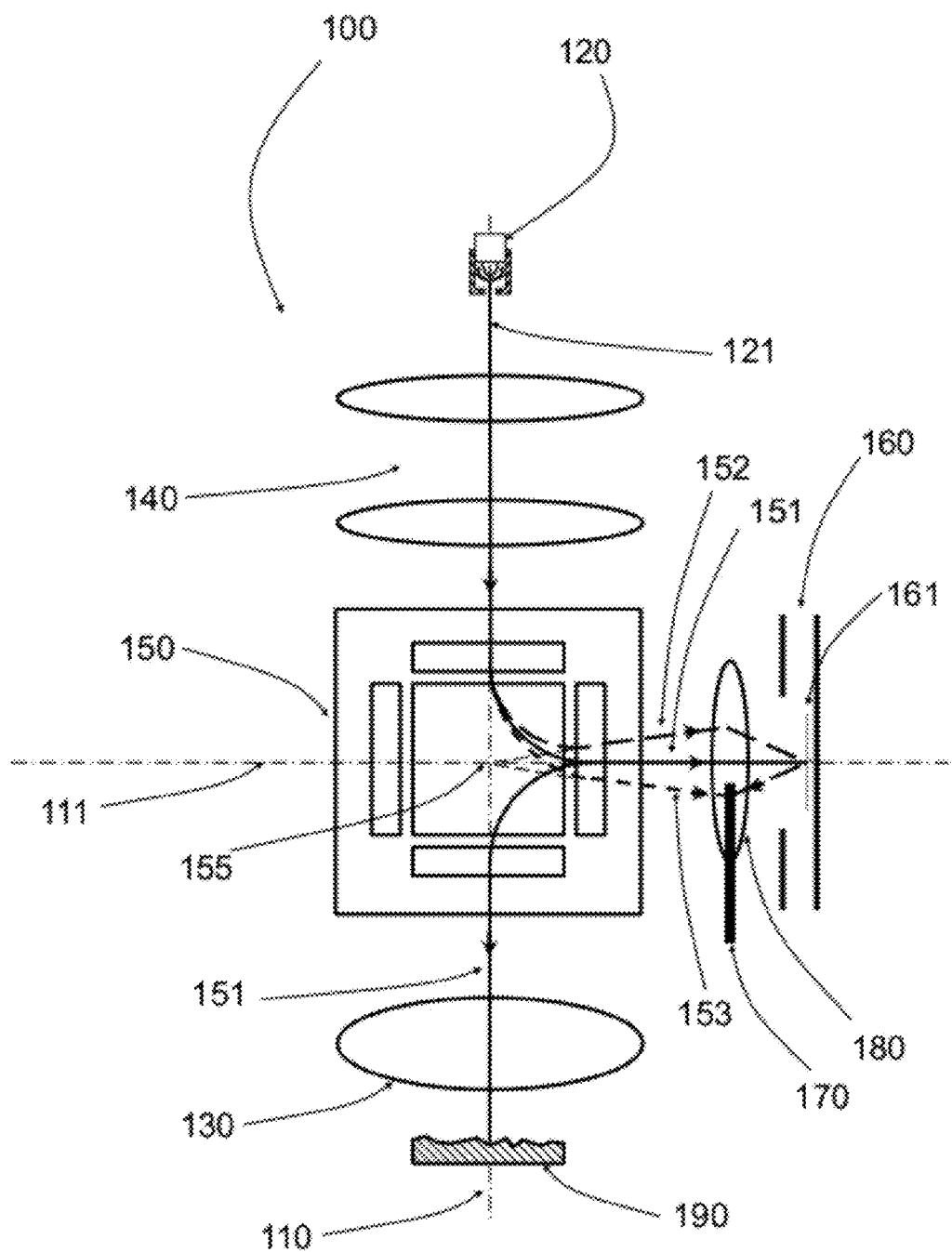
FIG. 1 is a diagram depicting a structure for an electron beam apparatus having an electron mirror-based monochromator in accordance with an embodiment of the invention.
Figure 2:
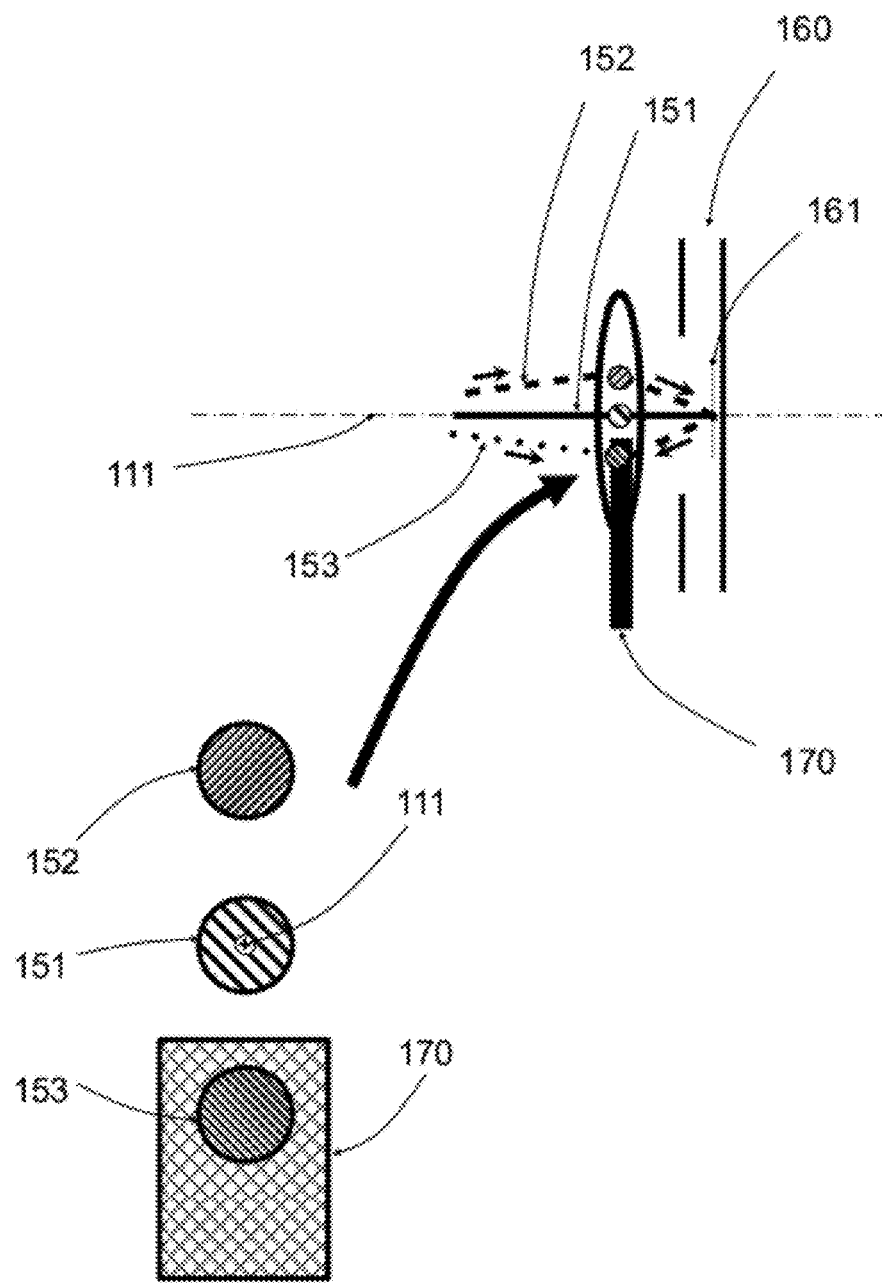
FIG. 2 is a diagram depicting the beam positions in an electron beam apparatus utilizing an electron mirror-based monochromator in accordance with an embodiment of the invention.

FIG. 1 is a diagram depicting a structure for an electron beam apparatus 100 comprising a prism separator and an electron mirror that are configured as an electron beam monochromator. In this apparatus 100, an electron gun 120 generates a primary electron energy beam 121 with an energy spread $\Delta E$ along the microscope axis 110 defined by the objective lens 130. One or more condenser lenses 140 collimate the primary beam into the prism separator 150, an energy dispersive element composed of an array of uniform magnetic fields of different length and strength so as to provide a mechanism for simultaneous deflection and stigmatic focusing. An optimized prism separator 150 simultaneously images stigmatically the primary beam 121 and deflects this beam by 90 degrees into the horizontal axis 111 defined by electron mirror 160. The electrons 151 with nominal beam energy $E_0$ are deflected by 90 degrees, while electrons 152 with slightly lower energy are deflected by a slightly larger angle and electrons 153 with slightly larger energy are deflected by a slightly smaller angle, due to the energy dispersion of the prism array. The axial bundle of electron rays 151, 152 and 153 with energies in the range ($E_0-\Delta E$, $E_0+\Delta E$) appears to emanate from a point near the center plane of the prism separator 150, also known as the achromatic plane 155. As the electrons 151, 152 and 153 proceed toward the electron mirror 160, a movable knife-edge plate 170 located slightly below the horizontal optical axis 111 stops one portion of the energy distribution, in this particular case the higher energy electrons 153 with energies $E_0+\Delta E$ as shown in FIG. 1. This is demonstrated in FIG. 2, which shows a front view of the knife-edge plate 170 and the approaching electrons 151, 152 and 153. In an alternate implementation, it is also possible to locate the knife-edge plate 170 slightly above the optical axis 111, in which case the lower energy electrons 152 with energies $E_0-\Delta E$ are stopped. Coming back to FIG. 1, the transfer lens 180 is configured to focus the achromatic plane at the reflection plane 161 of the electron mirror 160, which is biased slightly more negative than the electron gun 120, and thus reflects the electrons 151 and 152 back towards the prism separator 150. The electron mirror 160 is configured to reflect the incoming electrons symmetrically, i.e. electrons entering at an angle with respect to the normal to the electron mirror reflection plane 161 exit the mirror at the same angle and symmetrically with respect to the normal to the electron mirror reflection plane 161. As the remaining electrons 151 and 152 proceed back to the prism separator 150, the lower energy electrons 152 with energies $E_0-\Delta E$ are stopped by the same knife-edge plate 170, due to the symmetry of the reflection in the electron mirror 160. The energy spread of the remaining nearly monochromatic electrons 151 is defined by the position of the knife-edge plate and can be adjusted by moving the aperture away or towards the optical axis 111. This arrangement allows the use of a simple knife-edge plate as the energy selecting device, which is much simpler when compared to the narrow, often sub-micron slits needed in typical monochromator applications. The mechanical design and manufacture of a knife-edge plate is much less complex when compared with a narrow slit aperture with straight and parallel edges and thus allows to select a much narrower energy distribution. In this design, an energy width of 0.1 eV or less is achievable. In addition, the reliability of operation of a knife-edge plate under heavy electron bombardment is much improved when compared to slit apertures, as narrow, submicron wide slits tend to clog with electron-beam induced contamination. The remaining nearly monochromatic electrons 151 then enter the prism separator 150 which deflects this electron beam by 90 degrees back into the objective lens 130. After the double pass through the prism separator 150 and the electron mirror 160 the dispersion of the monochromator vanishes due to symmetry, which is desirable for high resolution imaging. In principle, the deflection angle of the prism array can be chosen arbitrarily, however a right angle deflection by 90 degrees is particularly advantageous, since after the second deflection the beam proceeds along the microscope axis 110, i.e. the monochromator can be introduced into a column with a straight axis.

Once the monochromatic electrons 151 are deflected into the objective lens 130, the electrons are focused by the objective lens 130 to form an electron beam that illuminates the specimen 190 with an appreciably reduced energy spread when compared to energy spread of the electrons emitted by the electron gun 120. The electrons are scattered by the specimen and further processed to form a 2-dimensional image.

The prism- and electron mirror-based monochromator, as shown in FIG. 1, can be advantageously implemented in both projection electron microscopes, e.g. TEMs and LEEMs, as well as SEMS, scanning transmission electron microscopes (STEM) and electron beam pattern generators. The reduced energy spread $\Delta E$ of the illuminating energy beam reduces chromatic aberrations that deteriorate the spatial resolution of both scanning and projection electron microscopes as well as electron beam pattern generators. The primary chromatic aberration is proportional to the relative energy spread $\Delta E/E$, and since the chromatic aberration increases with decreasing beam energy, an appreciable improvement of the resolution can be achieved when the energy spread $\Delta E$ is reduced, in particular at low beam energies.

Figure 3A:
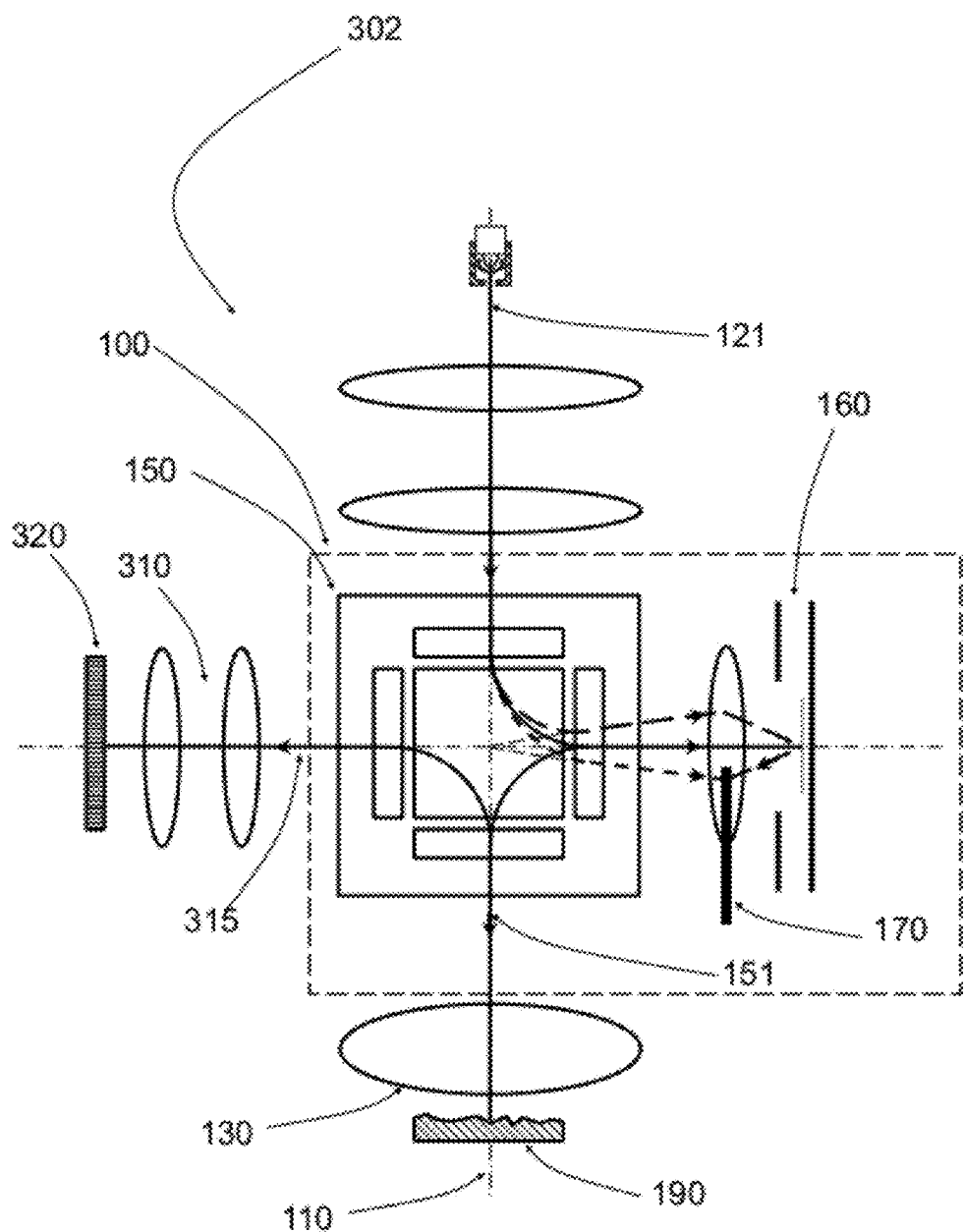
FIG. 3a is a diagram depicting a structure for an electron beam apparatus utilizing an electron mirror-based monochromator in a low energy electron microscope in accordance with an embodiment of the invention.

FIG. 3a is a diagram depicting a structure for a low energy electron microscope 302 comprising a prism separator 150 and an electron mirror 160 that are configured as an electron beam monochromator 100. In this microscope 302, the primary electron beam 121 is passed through the monochromator 100, and a fraction of the electron beam 151 with reduced energy spread is used for imaging. The energy spread of the remaining nearly monochromatic electrons 151 is defined by the position of the knife-edge plate 170 and can be adjusted by moving the knife-edge plate in or out of the beam path. This arrangement allows the use of a simple knife-edge plate as the energy selecting device, which is much simpler when compared to the narrow, often sub-micron slits needed in typical monochromator applications. The mechanical design and manufacture of a knife-edge plate is much less complex when compared with a narrow slit aperture with straight and parallel edges and thus allows to select a much narrower energy distribution. In this design, an energy width of 0.1 eV or less is achievable. In addition, the reliability of operation of a knife-edge plate under heavy electron bombardment is much improved when compared to slit apertures, as narrow, sub-micron wide slits tend to clog with electron-beam induced contamination. After the double pass through the prism separator 150 and the electron mirror 160 the dispersion of the monochromator vanishes due to symmetry, which is desirable for high resolution imaging. After the second deflection the beam proceeds along the microscope axis 110, i.e. the monochromator can be introduced into a column with a straight axis. The nearly monochromatic electron beam 151 exiting the monochromator 100 is focused by the final objective lens 130 to form a broad parallel beam that flood-illuminates the specimen 190. The electrons are scattered by the specimen and form a 2-dimensional image. The reflected scattered electron beam 315 then reenters the prism separator 150 and is deflected by 90 degrees into the projection optics 310. The 2-dimensional image that is formed by scattered electron beam 315 is magnified by the projection optics 310 on an electron detector 320. The electron detector comprises an electron scintillator, transforming the two-dimensional electron image into a light image, and light optics configured to transport the light image to an image sensor, e.g. a charged-coupled device.

Figure 3B:
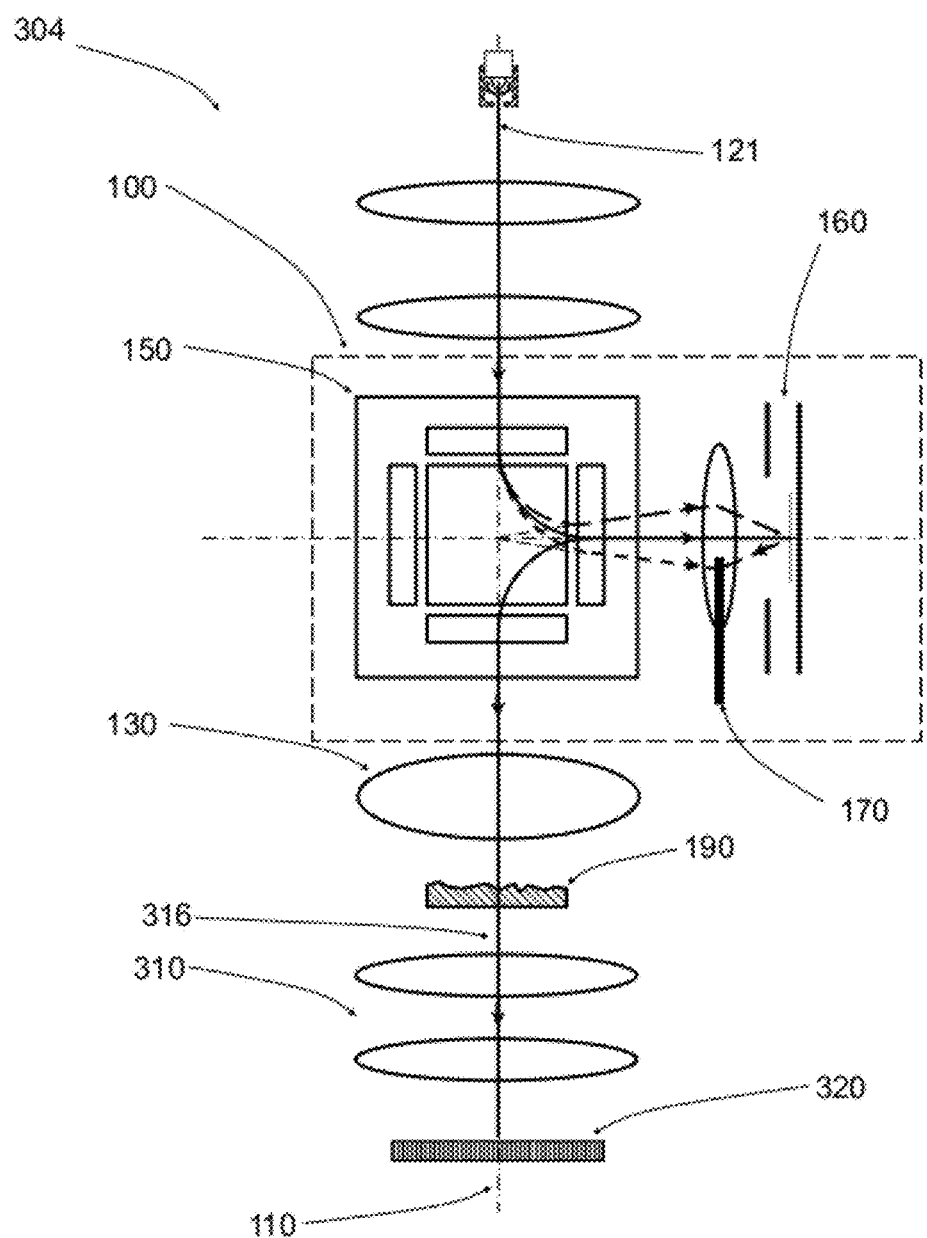
FIG. 3b is a diagram depicting a structure for an electron beam apparatus utilizing an electron mirror-based monochromator in a transmission energy electron microscope in accordance with an embodiment of the invention.

FIG. 3b is a diagram depicting a structure for a a transmission electron microscope 304 comprising a prism separator and an electron mirror that are configured as an electron beam monochromator 100. In this microscope 304, the primary electron beam 121 is passed through the monochromator 100, and a fraction of the electron beam 151 with reduced energy spread is used for imaging. The energy spread of the remaining nearly monochromatic electrons 151 is defined by the position of the knife-edge plate 170 and can be adjusted by moving the knife-edge plate in or out of the beam path. This arrangement allows the use of a simple knife-edge plate as the energy selecting device, which is much simpler when compared to the narrow, often sub-micron slits needed in typical monochromator applications. The mechanical design and manufacture of a knife-edge plate is much less complex when compared with a narrow slit aperture with straight and parallel edges and thus allows to select a much narrower energy distribution. In this design, an energy width of 0.1 eV or less is achievable. In addition, the reliability of operation of a knife-edge plate under heavy electron bombardment is much improved when compared to slit apertures, as narrow, sub-micron wide slits tend to clog with electron-beam induced contamination. After the double pass through the prism separator 150 and the electron mirror 160 the dispersion of the monochromator vanishes due to symmetry, which is desirable for high resolution imaging. After the second deflection the beam proceeds along the microscope axis 110, i.e. the monochromator can be introduced into a TEM column with a straight axis. The nearly monochromatic electron beam 151 exiting the monochromator 100 is focused by the objective lens 130 to form a broad parallel beam that flood-illuminates the specimen 190. The electrons are scattered by the specimen and form a 2-dimensional image. The transmitted scattered electron beam 316 is magnified by the projection optics 310 on an electron detector 320. The electron detector comprises an electron scintillator transforming the two-dimensional electron image into a light image and light optics configured to transport the light image to an image sensor, e.g. a charged-coupled device.

Figure 3C:
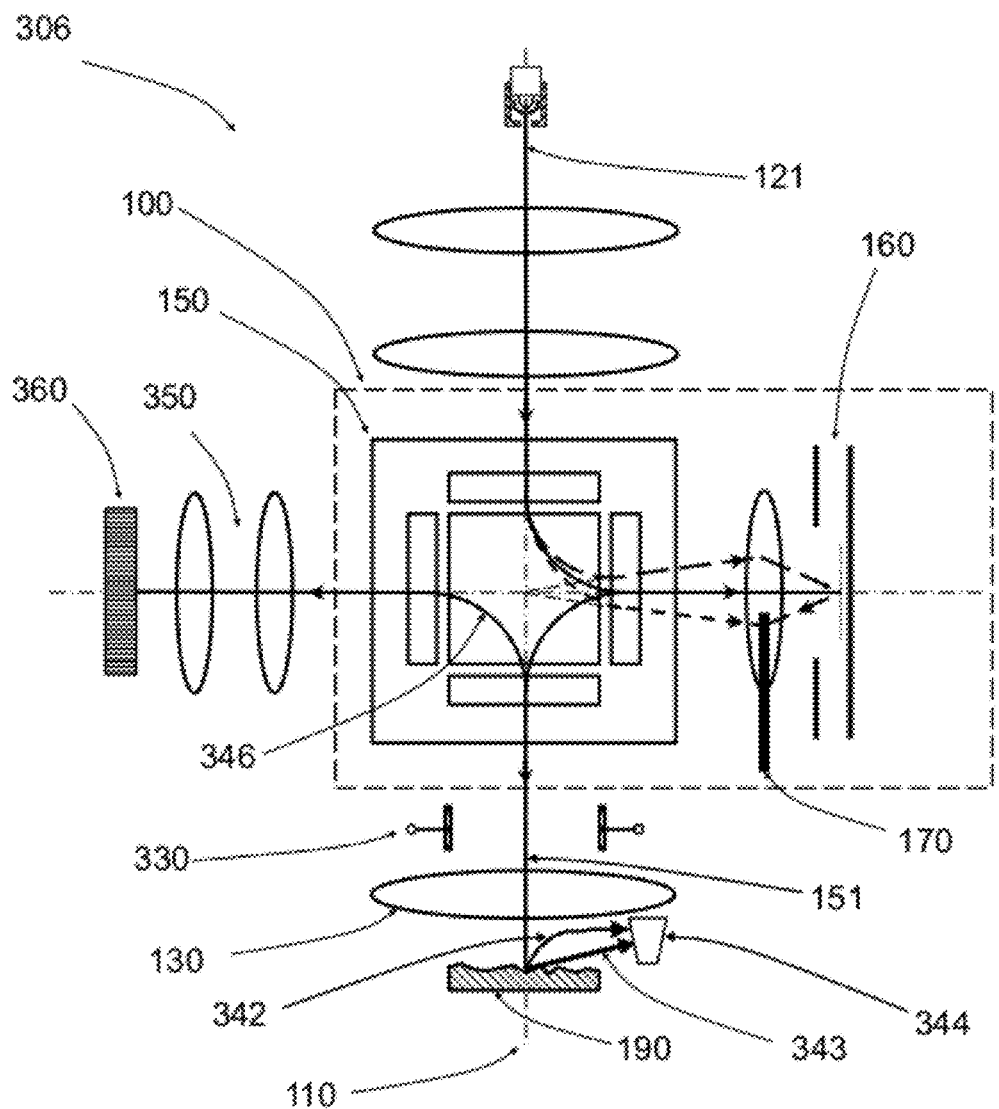
FIG. 3c is a diagram depicting a structure for an electron beam apparatus utilizing an electron mirror-based monochromator in a scanning electron microscope in accordance with an embodiment of the invention.

FIG. 3c is a diagram depicting a structure for a a scanning electron microscope 306 comprising a prism separator and an electron mirror that are configured as an electron beam monochromator 100. In this microscope, the primary electron beam 121 is passed through the monochromator 100, and a fraction of the electron beam 151 with reduced energy spread is used for imaging. The energy spread of the remaining nearly monochromatic electrons 151 is defined by the position of the knife-edge plate 170 and can be adjusted by moving the knife-edge plate in or out of the beam path. This arrangement allows the use of a simple knife-edge plate as the energy selecting device, which is much simpler when compared to the narrow, often sub-micron slits needed in typical monochromator applications. The mechanical design and manufacture of a knife-edge plate is much less complex when compared with a narrow slit aperture with straight and parallel edges and thus allows to select a much narrower energy distribution. In this design, an energy width of 0.1 eV or less is achievable. In addition, the reliability of operation of a knife-edge plate under heavy electron bombardment is much improved when compared to slit apertures, as narrow, sub-micron wide slits tend to clog with electron-beam induced contamination. After the double pass through the prism separator 150 and the electron mirror 160 the dispersion of the monochromator vanishes due to symmetry, which is desirable for high resolution imaging. After the second deflection the beam proceeds along the microscope axis 110, i.e. the monochromator can be introduced into a SEM column with a straight axis. The nearly monochromatic electron beam 151 is focused by the final objective lens 130 on the specimen 190 to a spot about 0.1 nm to 100 nm in diameter. The beam is deflected by pairs of magnetic scanning coils or electrostatic deflector plates 330, sweeping in a raster fashion over a rectangular area of the substrate surface. When the primary electron beam 121 strikes the specimen 190, the primary electrons scatter and generate elastically backscattered electrons, secondary electrons due to inelastic scattering, and characteristic Auger electrons. The secondary electrons 342 and elastically backscattered electrons 343 scattered at high angles can be captured by an electron detector 344 located near the specimen 190. In addition, the elastically backscattered electrons 346 scattered at low angles enter the prism separator 150 which deflects this electron beam by 90 degrees into the second detection system. The elastically backscattered electrons 346 get collimated by transfer lenses 350 and captured on electron detector 360. The signal generated by detectors 344 and 360 is then amplified and displayed on a CRT display or captured digitally, pixel by pixel on a computer.

Figure 4:
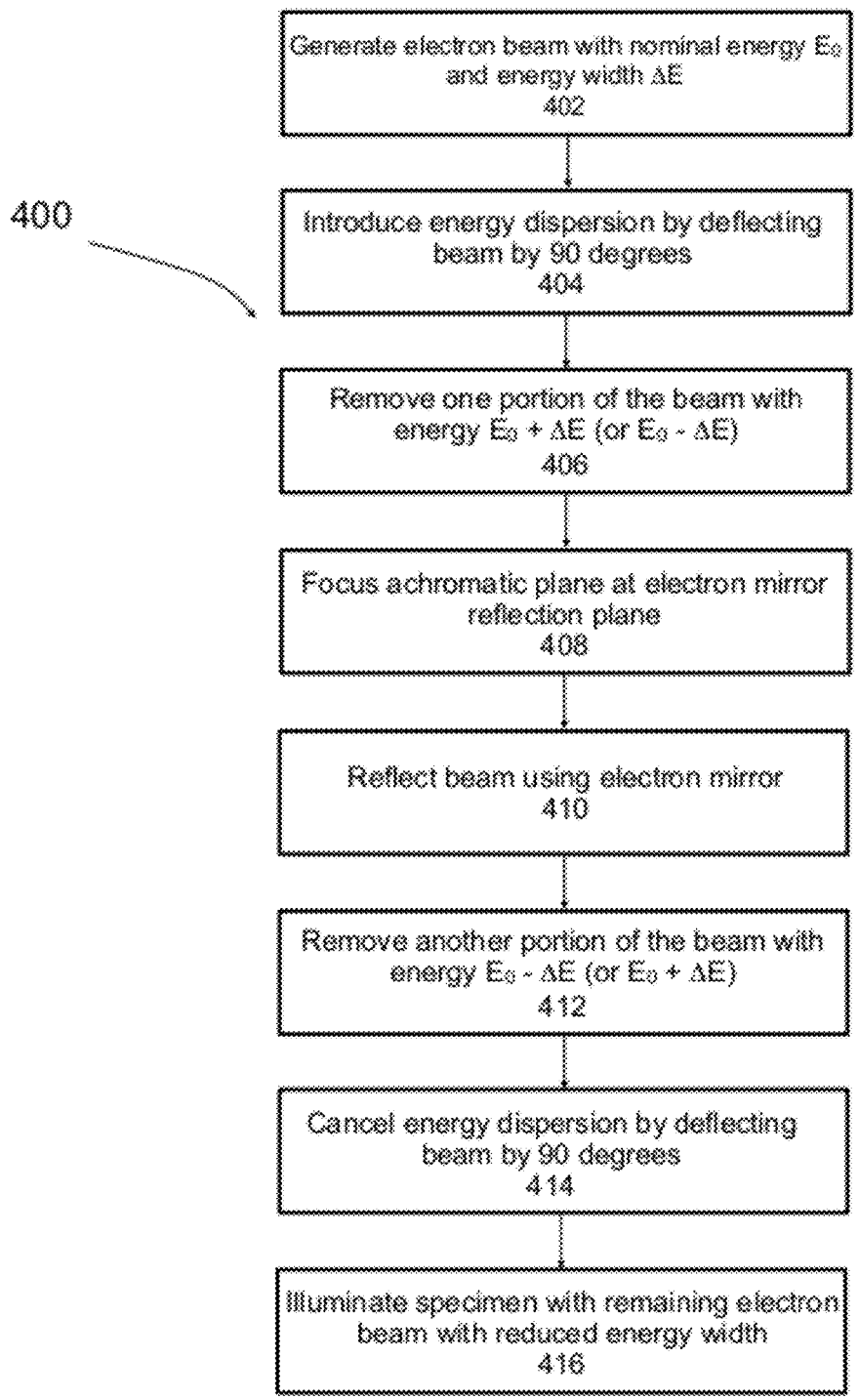
FIG. 4 is a flow chart depicting a method for imaging of a specimen using an electron mirror-based monochromator in accordance with an embodiment of the invention.

FIG. 4 is a flow chart depicting a method 400 for reducing the electron beam energy spread using a prism separator and electron mirror in accordance with an embodiment of the invention. This method 400 may use the structures 100, 302, 304 and 306 described above in relation to FIGS. 1-3.

An electron beam with nominal energy $E_0$ and energy width $\Delta E$ is generated 402 by an electron gun. The electron beam is deflected by 90 degrees 404 to introduce dispersion according to the electron energy. This is done by a prism separator bending the high-energy component of the beam at less of an angle in comparison to its bending of the low-energy component of the beam, such that the higher and lower energy electron-beam components exit the separator at different angles of trajectory. A knife-edge plate removes one portion of the beam 406, either the higher energy beam $E_0+\Delta E$ or the lower energy beam $E_0-\Delta E$. One or more lenses are used to focus the achromatic plane of the prism separator, located near its center, at the reflection plane of an electron mirror 408. The mirror reflects the electron beam 410 and due to symmetry, the portion of the beam with energy $E_0-\Delta E$ (or $E_0+\Delta E$) is removed 412 by the knife-edge plate. The remaining portion of the electron beam with nominal energy $E_0$ and reduced energy width is then deflected 414 back by 90 degrees, which cancels the dispersion of the monochromator after the beam exit. The remaining electron beam with reduced energy spread is then directed to impinge on the specimen 416.

Advantageously, the above-disclosed technique allows the use of a simple knife-edge plate as the energy-selecting device, which is much simpler when compared to the narrow, often sub-micron slits needed in typical monochromator applications. The mechanical design and manufacture of a knife-edge plate is much less complex when compared with a narrow slit aperture with straight and parallel edges and thus allows to select a much narrower energy distribution. In addition, the reliability of operation of a knife-edge plate under heavy electron bombardment is much improved when compared to slit apertures, as sub-micron slits tend to clog with electron-beam induced contamination.

CONCLUSION

A monochromator comprising an energy-dispersive prism separator and an electron mirror is disclosed herein. The prism array separator deflects the electron beam by 90 degrees and thus introduces dispersion according to the electron energy. The magnetic prism separator bends the high-energy component of the beam at less of an angle in comparison to its bending of the low-energy component of the beam, such that the higher and lower energy electron-beam components exit the separator at different angles of trajectory. A knife-edge plate removes one portion of the beam with energy larger (or smaller) then the nominal energy. One or more lenses are used to focus the achromatic plane of the prism separator, located near its center, at the reflection plane of an electron mirror. The mirror reflects the electron beam and due to symmetry, the remaining portion of the beam is removed by the same knife-edge plate. The remaining portion of the electron beam with nominal energy and reduced energy spread is then deflected back by 90 degrees, which cancels the dispersion of the energy filter after the beam exit.

In accordance with certain embodiments of the invention, this monochromator provides the opportunity to illuminate specimens with an electron beam with a narrow energy spread, resulting in smaller chromatic aberrations. Hence, higher spatial resolution imaging is obtainable in electron microscopes used to characterize specimens and higher spatial resolution patterning is obtainable in electron beam pattern generators used to pattern substrates.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for producing a charged particle beam with reduced energy width from a charged particle beam with a range of energies, the apparatus comprising:
    an energy-dispersive device that bends the high-energy component of the charged particle beam at less of an angle in comparison to the bending angle of the low-energy component of the charged particle beam, such that the higher and lower energy charged particle beam components exit said energy-dispersive device at different angles of trajectory;
    a charged particle mirror configured to reflect the charged particle beam, wherein charged particles entering at an angle with respect to the normal to the reflection plane of said mirror exit the mirror symmetrically with respect to said normal and at the same angle;
    a plurality of charged particle lenses configured to converge all energy components exiting said energy-dispersive device at different angles of trajectory at the charged particle mirror reflection plane; and
    a movable knife-edge plate positioned between the energy-dispersive device and the charged particle mirror that removes all charged particles with energies higher and lower than a selected energy.

2. The apparatus of claim 1, wherein the energy-dispersive device bends the charged particle beam of said selected energy by ninety degrees.

3. The apparatus of claim 1, wherein the energy-dispersive device is a magnetic prism composed of an array of uniform magnetic fields of different length and strength with corresponding transient magnetic fields.

4. The apparatus of claim 1, wherein said charged particle beam is passed through said energy-dispersive device a second time and due to symmetry exits said energy-dispersive device without energy dispersion.

5. The apparatus of claim 4, further comprising:
    a charged particle source configured to generate a charged particle beam with a range of energies;
    a plurality of charged particle lenses configured to transport said charged particle beam into said energy-dispersive device; and
    a plurality of charged particle lenses configured to transport the charged particle beam with reduced energy width exiting said energy-dispersive device and direct it on a specimen.

6. The apparatus of claim 5, further comprising:
    a specimen scattering a beam of illuminating charged particles; and
    a plurality of charged particle lenses configured to transport said scattered charged particle beam to a charged particle detector.

7. The apparatus of claim 6, wherein said plurality of charged particle lenses forms a two-dimensional charged particle image of the specimen on the charged particle detector.

8. The apparatus of claim 7, wherein said charged particle detector comprises:
an electron scintillator transforming said two-dimensional charged particle image into a light image;
a light optics configured to transport said light image to an image sensor, said image sensor being a charged-coupled device.

9. The apparatus of claim 6, wherein said plurality of charged particle lenses focuses the charged particle beam into a small spot that is scanned across the specimen.

10. The apparatus of claim 1, further comprising:
a charged particle source configured to generate a charged particle beam with a range of energies;
a plurality of charged particle lenses configured to transport said charged particle beam into said energy-dispersive device; and
a plurality of charged particle lenses configured to transport the charged particle beam with reduced energy width exiting said energy-dispersive device and direct it on a resist-coated substrate; and
a blanking device configured to selectively stop the charged particle beam prior to striking the sample.

11. A method for generating a charged particle beam with reduced energy width, the method comprising:
generating a charged particle beam with a range of energies;
bending charged particle beam components with higher and lower energy at different angles of trajectory;
reflecting the charged particle beam in a charged particle mirror such that charged particles entering at an angle with respect to the normal to the mirror reflection plane exit symmetrically at the same angle with respect to said normal;
converging electrons with all energy components bent at different angles of trajectory at the mirror reflection plane; and
removing all charged particles with energies higher and lower than a selected energy by a movable knife-edge plate.

12. The method of claim 11, wherein the charged particle beam with selected energy is bent by ninety degrees.

13. The method of claim 11, wherein said charged particle beam is passed through said energy-dispersive device a second time and due to symmetry exits said energy-dispersive device without energy dispersion.

14. The method of claim 11, further comprising:
transporting the charged particle beam with reduced energy width and directing it on a specimen.

15. The method of claim 14, further comprising:
scattering a beam of illuminating charged particles by a specimen; and
transporting the charged particle beam scattered by the specimen to a charged particle detector.

16. The method of claim 15, wherein a two-dimensional charged particle image of the specimen is formed on the charged particle detector.

17. The method of claim 16, further comprising:
transforming said two-dimensional charged particle image into a light image; and
transporting said light image to an image sensor, said image sensor being a charged-coupled device.

18. The method of claim 14, wherein the beam striking the specimen is focused into a small spot that is scanned across the specimen.

19. The method of claim 11, further comprising:
transporting the charged particle beam and directing it on a resist-coated substrate; and
blanking the charged particle beam selectively so as to stop the beam prior to striking the sample.

* * * * *